United States Patent
Chae

(10) Patent No.: US 6,981,465 B2
(45) Date of Patent: Jan. 3, 2006

(54) CHEMICAL VAPOR DEPOSITION PROCESS AND APPARATUS THEREOF

(75) Inventor: Ki-Woong Chae, Chungcheongnam-do (KR)

(73) Assignee: Precision Diamond Technologies Co., Ltd., Chungcheongnam-do (KR)

( * ) Notice: Subject to any disclaimer, the term of this patent is extended or adjusted under 35 U.S.C. 154(b) by 79 days.

(21) Appl. No.: 10/469,016

(22) PCT Filed: Feb. 26, 2002

(86) PCT No.: PCT/KR02/00315

§ 371 (c)(1),
(2), (4) Date: Aug. 26, 2003

(87) PCT Pub. No.: WO02/068709

PCT Pub. Date: Sep. 6, 2002

(65) Prior Publication Data

US 2004/0069231 A1 Apr. 15, 2004

(30) Foreign Application Priority Data

Feb. 26, 2001 (KR) .................................. 2001-9598

(51) Int. Cl.
*C23C 16/27* (2006.01)

(52) U.S. Cl. .............................. 118/723 HC; 118/724; 427/249.11

(58) Field of Classification Search ........... 427/249.11; 118/724, 723 HC

See application file for complete search history.

(56) References Cited

U.S. PATENT DOCUMENTS

| 4,958,592 | A | | 9/1990 | Anthony et al. |
| 4,970,986 | A | | 11/1990 | Anthony et al. |
| 5,314,570 | A | * | 5/1994 | Ikegaya et al. ............. 117/103 |
| 5,833,753 | A | * | 11/1998 | Herlinger et al. ........... 118/724 |

* cited by examiner

*Primary Examiner*—Bret Chen
(74) *Attorney, Agent, or Firm*—Merchant & Gould P.C.

(57) ABSTRACT

The present invention is related to an apparatus for forming diamond via a chemical vapor deposition process using hot metal filament based on hydrogen and methane gas, and a method thereof. In particular, the present invention provides an apparatus for using the hot filament repeatedly without breakage, in comparison with the conventional apparatus that the filament is limited in one use, and a method thereof. The apparatus that the filament is limited in one use, and a method thereof. The apparatus includes a base substrate wherein diamond is synthesized by heating filament due to supply of voltage, a pair of electrodes being located above the base substrate, and a plurality of hot filaments being placed over the both electrodes. The top portion of the electrodes has a flat surface that is parallel with the filament, and the side portion has a curved surface. A plurality of filaments is smoothly hanged to both electrodes according to the flat surface and the curved surface without fixing. At the flat surface, the filament does not generate heat, so the breakage of the filament due to carburization is prevented. Furthermore, the end of each filament is weighed with individual weight in order to provide the filament with the tension by only gravitation. Even though the length of the filament is changed by temperature change during the diamond forming, the filament is not slacked between the electrodes by the tension. Therefore, by using the apparatus and the method of the present invention, the filament can be repeatedly used without breakage.

5 Claims, 2 Drawing Sheets

CHEMICAL VAPOR DEPOSITION PROCESS AND APPARATUS THEREOF

BACKGROUND OF THE INVENTION

1. Field of the Invention

The present invention generally relates to an apparatus for synthesizing diamond via a chemical vapor deposition process using hot metal filament and a method thereof. In particularly, the present invention relates to an apparatus and a method for using the hot filament repeatedly without breakage, in comparison with the conventional apparatus that the filament is limited in one use.

2. Description of the Prior Art

A conventional apparatus for forming diamond via a chemical vapor deposition process using hot metal filament puts its focus on preventing hot metal filament from being (slacked while the filament is limited in one use.

However, the present invention is related to an apparatus completely preventing the filament from being slacked at high temperature, and it provides an apparatus for using the hot filament repeatedly without breakage and a method thereof.

Diamond has the high industrial applicability because of its excellent hardness, thermal conductivity, electric insulating property, optical property and other chemically stable physical characteristics.

Particularly, the importance of diamond has been emphasized in the 1980s since a chemical vapor deposition process based on hydrogen and methane gas is used.

As a result, various methods for efficiently sythesizing diamond via a chemical vapor deposition process are suggested. Notable among these methods is a method for depositing diamond by chemical vapor deposition using hot metal filament. It is simple in its equipment and economical because diamond can be synthesized in larger sizes. Due to these characteristics, this method is actively studied.

Generally, it has been known that diamond can be synthesized when metal filament is maintained at a temperature of 1800~2500° C. but a base substrate at a temperature of 700~1100° C., and a gas is then injected during the process of synthesizing diamond using hot filament.

In other words, the above-described method has a simpler structure than the conventional one.

However, the method has special problems because metal filament needs being maintained at a high temperature. To overcome those problems is the most important and crucial technique for synthesizing diamond using hot metal filament. Accordingly, those problems will be examined hereinafter.

Diamond for being synthesized needs being maintained at a temperature of over 2000° C. Here, the length of metal filament is continuously changed by thermal expansion.

Particularly, the filament is slacked at a high temperature, because the filament is deformed by its weight at a high temperature.

In other words, it is necessary to control properly the temperature of diamond for being synthesized. Additionally, it is also important to maintain the region for synthesizing diamond at a settled temperature for hours because the diamond has the slow growth rate of 0.5~2 $\mu$m/h.

However, the phenomenon wherein the filament is slacked or broken makes it impossible to control the temperature of diamond for being synthesized. The phenomenon also causes the temperature gradient, and makes it impossible to regulate the distance between the filament and the base substrate wherein diamond is synthesized. As a result, diamond cannot be synthesized.

Another problem is the carburization of metal filament while the process of synthesizing diamond is performed under the carbonizing (i.e. methane gas) condition.

In other words, if the metal filament is previously carbonized, its volume is expanded and its form is seriously distorted. This phenomenon causes the filament to be changed in its length and to have the internal stress. First of all, the previously carbonized filament has the same brittleness such as that of ceramics. As a result, the filament tends to be broken by external force or impact.

Particularly, if it is considered that the general diameter of the filament used in synthesizing diamond is 0.02~0.5 mm, it is difficult to maintain the carbonized filament without breakage.

In other words, tungsten is generally used as the filament. Here, tungsten carbide is formed by the carburization of the filament, thereby resulting in the brittleness of ceramics.

Due to this problem, the brittle filament is broken by its expansion and contraction when the filament used in synthesizing diamond is heated to a high temperature and then cooled to a ambient temperature.

To control and prevent the problem is very important for a chemical vapor deposition process.

Additionally, the brittleness causes the filament to be limited in one use for synthesizing diamond.

The above-described problems of the filament cause more serious problems in designing the equipment for large area.

There have been various methods to prevent the hot filament from breakage by the brittleness resulting from the slack and carburization of the hot filament. Among these methods, the U.S. patent application Ser. No. 4,953,499 provides a pre-stressed curved filament to endure the thermal expansion and the carburization of the filament.

However, in this method, the filament is easily broken when it is pre-stressed. The previously curved filament has the internal stress, therefor it tends to be arranged to an undesired direction and form by the rise of temperature.

Particularly, if the curved filament is placed on a mis-fixed electrode, it is changed into an undesired size and form by the carburization of the filament. As a result, it is impossible to regulate the changed filament.

The U.S. Pat. No. 4,970,986 provides another method that copes with thermal expansion of the metal filament by mounting individual spring on the filament to previously have a tensile stress.

However, in this method, since the spring is once. mounted inside of the apparatus for synthesizing diamond, it is impossible to regulate the spring while synthesizing diamond. Additionally, since the spring has the excessive stress, the extremely thin filament is easily broken.

Although a plug is mounted on the opposite side to regulate the stress, it is still difficult to regulate properly the individual stress of a plurality of filaments.

The U.S. Pat. No. 4,958,592 provides a method to regulate the transformation resulting from the thermal expansion and carburization of the filament by installing the complicated counterbalancing weight assembly on the filament which is located perpendicularly and generates heat.

However, this method still has many problems. The counterbalancing weight assembly has a bar which applies a tension to the filament. The bar is slipped down by a bearing and then connected to the end of the counterbalancing bar (lever). Counterbalancing weights are placed on the opposite side of this counterbalancing bar.

A supporting rod of the lever is hung on the synthetic equipment by a string. This counterbalancing weight assembly is easily fluctuated in every direction even by near small impact. As a result, it is impossible to adjust the filament.

Because a tensile bar is moved by the bearing, it is possible to control the weight in an up-and-down or circumferential movement but impossible to adjust the three-dimensional movement (swing or vibration) of the weight.

First of all, a perpendicularly mounted filament is connected to the complicated counterbalancing weight assembly (tensile bars, levers, weights) hung to the synthetic equipment. Accordingly, it is improper structure in synthesizing diamond with large size using a plurality of filaments.

The U.S. Pat. No. 5,833,753 and U.S. Pat. No. 5,997,650 provide a method to move electrodes (movable electrodes) wherein filaments are arranged and to regulate a tensile stress by installing a force regulator on the movable electrodes.

This method needs the complicated subsidiary equipment and the precision control to fix a plurality of filaments having the identical length respectively on the movable electrodes.

The Korean Patent No. 100,286 provides a method of absorbing the change in length of the filament during its thermal expansion by forming a hole whereon the end of the filament is slipped to electrodes. In this method, a supporting bar is mounted between electrodes lest the filament should be slacked. However, this method has shortcoming that a lot of supporting bars is required, even if the length of filaments gradually increases.

The Korean Patent Application No. 105,943 provides a method of preventing the filament from being slackened at a high temperature. In this method, the filament is formed into double lines twisted with several single ones. These filaments having a spiral form are contracted parallel with the lines during its carburization. In this way, it is possible to prevent the filament from being slackened. However, it is desirable to use short filaments. If the filaments become longer, it is impossible to prevent the filament from being slackened by its weight because of the limit in its contraction.

The above-described conventional methods need all intricate subsidiary equipment. Particularly, these methods place their emphasis on the prevention of slackening filaments and they are not considered in usage count of filaments.

In other words, those methods relate to the control and installment of filaments for synthesizing diamond limited in one use. Here, the possibility of using the filaments repeatedly is excluded. The filaments have a problem in the structure wherein they cannot be used repeatedly.

Although the Korean Patent No. 100,286 and 105943 among those methods suggest the possibility of using the filaments repeatedly, but still have a structural problem in synthesizing diamond with large size.

SUMMARY OF THE INVENTION

The present invention provides an apparatus for forming diamond with large size without pre-stressing metal filament to be curved lightly or having any intricate subsidiary equipment such as spring, movable electrodes, counterbalancing weight assembly and force regulators.

To overcome the above-described conventional problems, the present invention provides an apparatus including: a central base substrate wherein diamond is synthesized by heating filament due to supply of voltage; a flat surface of the electrode without generating heat, which is contacted with the filament placed over the both electrodes; and the weight hanged to end of each filament. Thereby, it is possible to prevent the filament from being expanded, contracted or carbonized. As a result, diamond can be synthesized with large size.

Conventionally, the disposable metal filament is used in synthesizing diamond. However, in the present invention, it is possible to use the filament repeatedly because repetitive changes are naturally controllable. It is also easy to enlarge the size of diamond, and unnecessary to regulate precisely the installments of filament for synthesizing diamond. As a result, the equipment for synthesizing diamond using hot filament has the simplified structure. Thereby, its productivity and economy are improved.

The present invention is characterized in that changes in the length of filament can be controlled without breakage resulting from its weight to maintain the tension applied to each filament although metal filament is changed in its length due to the change of temperature and has the brittleness due to its carburization.

More specifically, a method for depositing diamond by chemical vapor deposition using hot metal filament based on hydrogen and methane gas as a heat source for analyzing vapor ingredients in high temperature, is characterized in that: a pair of electrodes is located on a central base substrate wherein diamond is synthesized by heating filament due to supply of voltage, and a flat surface wherein a plurality of hot filaments are placed over the top portion of both electrodes and they do not generate heat.

In this method, a plurality of filaments are smoothly hanged to both electrodes according to the flat surface and the curved surface without being fixed so that the filaments can be freely moved according to thermal changes such as heat expansion, contraction and carbonation.

In this method, the both ends of each filament are weighed with individual weight in order to provide the filament placed over the top portion of the electrodes with the tension only by gravitation.

BRIEF DESCRIPTION OF THE DRAWINGS

The present invention will be explained in terms of exemplary embodiments described in detail with reference to the accompanying drawings, which are given only by way of illustration and thus are not limitative of the present invention, wherein.

DESCRIPTION OF THE PREFERRED EMBODIMENTS

Figure 1:
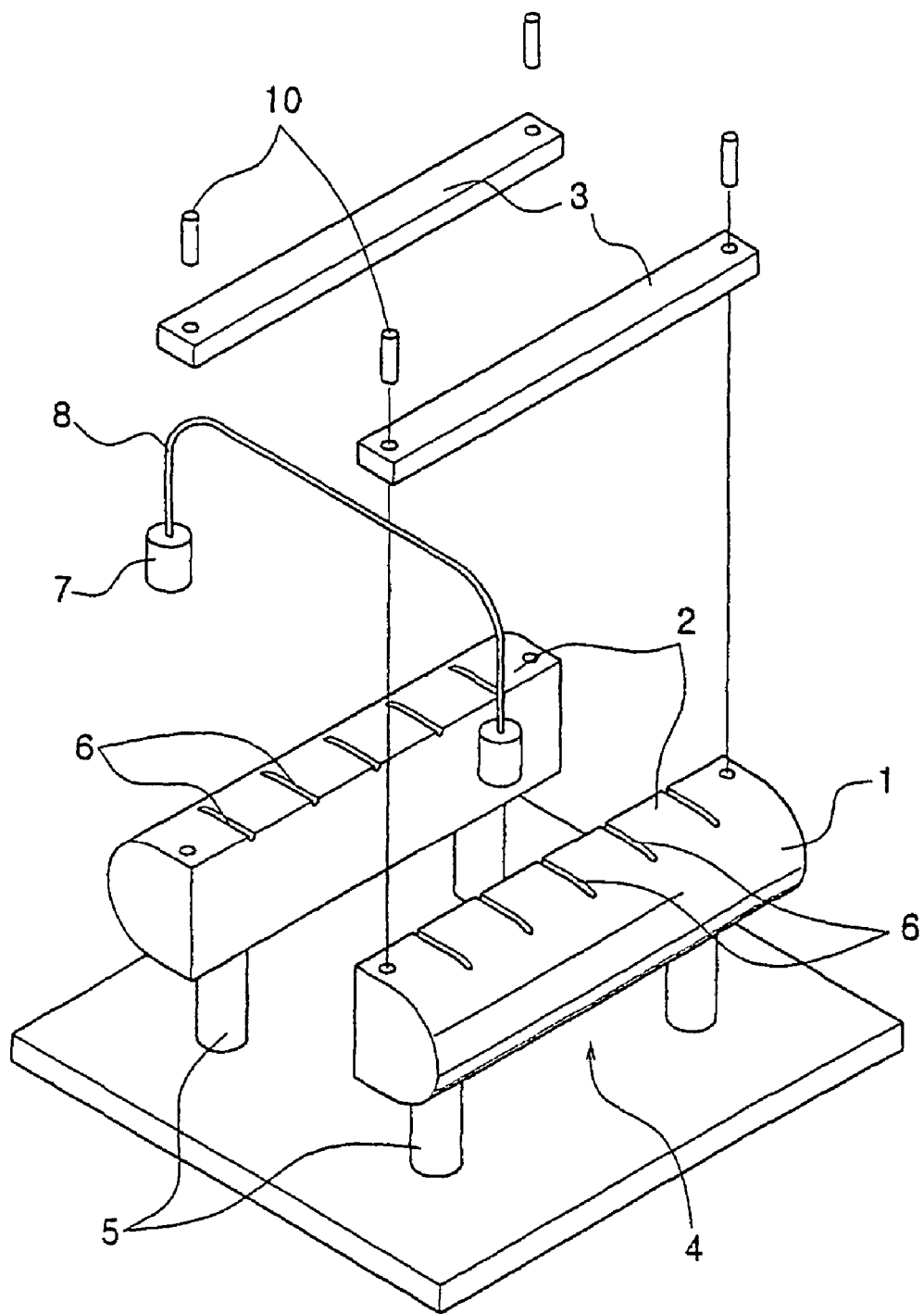
FIG. 1 is a perspective view of illustrating the exploded apparatus of the present invention.
Figure 2:
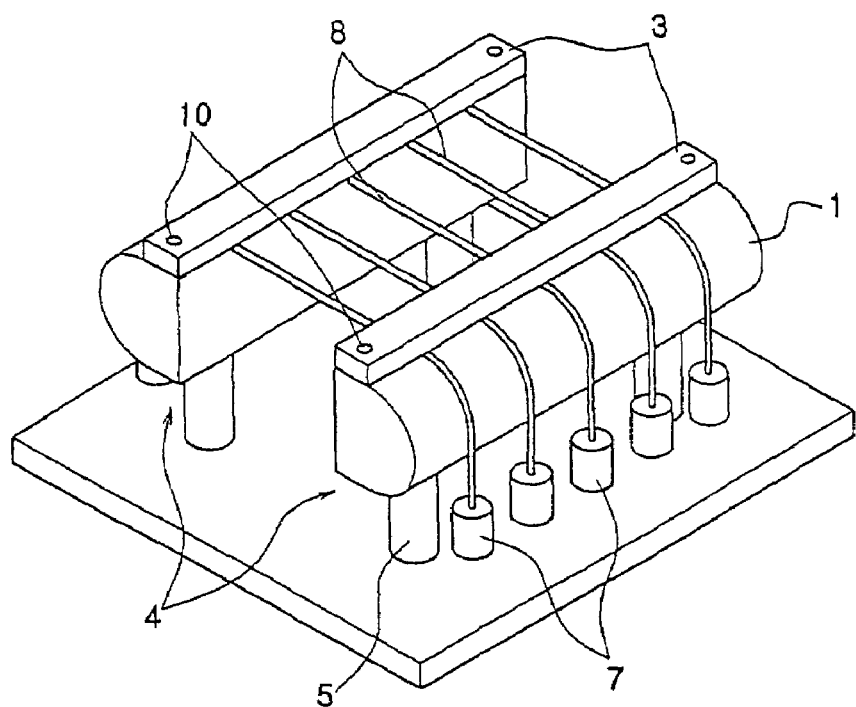
FIG. 2 is a state diagram illustrating the assembled the apparatus of the present invention.

FIGS. 1 and 2 specifically illustrate the structure and operation of electrodes and a method of installing the filament in accordance with the present invention.

A pair of electrodes 4 having conductivity includes a flat surface 2 on the top side of each electrode and a curved surface 1 on the outer side of electrode. On the flat surface 2, a plurality of slots 6 is formed at a predetermined interval, respectively. A power supply member 5 is formed to fix the electrodes 4 and supply power on the bottom portion of the electrodes 4. A plurality of metal filaments 8 are located on the slots 6 formed on the flat surface 2, and a metal weight 7 is hanged to the both ends of each filament. While each filament 8 is tightly hung between the electrodes 4, the filament 8 is fixed with conductive cover plates 3.

The cover plates 3 enable the filament 8 to be surely contacted on the electrodes 4. Accordingly, if the filament 8 is continuously contacted on the slot 6 formed on the flat surface 2 or on the flat surface 2 of electrodes 4, the object of the present invention is achieved.

The reference number 10 that is not described is a pin to fix the electrodes 4 on the cover plates 3.

A plurality of slots 6 are formed on the flat surface 2 of the electrodes 4 so that the metal filament 8 can be located at a predetermined interval and the filament 8 cannot be contacted with its neighboring filament.

Additionally, the outer side of electrodes 4 is formed of the curved surface 1 so that the small and brittle filament 8 may be maintained without breakage resulting from heat expansion, contraction or abrupt fracture of transformation and so that individual weight may be naturally transferred to apply the tension to the filament 8.

This curved surface 1 may be used by adjusting the curvature of the curved surface according to the diameter of the filament 8.

The end of each filament having its predetermined weight is weighed with individual metal weight 7 in order to provide the filament with the tension. When the filament, which will generate heat at a high temperature, is heated, the filament is expanded by heat and then slackened between two electrodes. This slackened filament is fastened by the tension due to the metal weights 7 hanged to the both ends of each filament 8, and the filament 8 to be maintained parallel with each other.

The conductive cover plate 3 can solve the problems such as heat expansion, contraction and brittleness due to the carburization without breakage by its weight having only gravitation.

The operation of the apparatus of the present invention will be explained with reference to FIG. 3.

Figure 3:
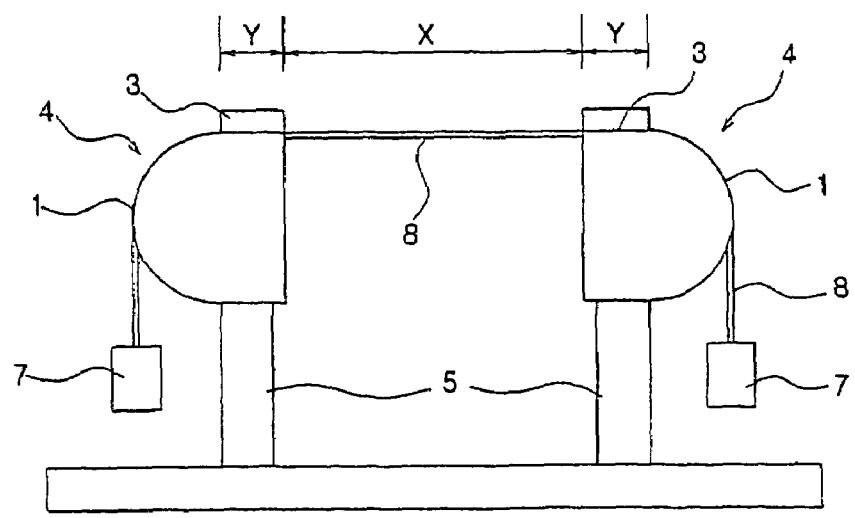
FIG. 3 is a cross-sectional view illustrating the operation of the apparatus of the present invention.

When power is supplied via the power supply member 5, the filament generates heat at high temperature in the region "X" as shown in FIG. 3.

The filament does not generate heat in the region "Y" of FIG. 3 because the filament 8 is contacted with the flat surface 2 or the slot 6 formed on the top side of electrodes 4. Here, the cover plate 3 is mounted to fix the filament on the flat surface 2 or the slot 6.

Accordingly, the filament 8 maintains its metal characteristic as it is because the filament 8 does not generate heat in the region "Y" and thereby its carburization is prevented.

The filament 8 is carbonized in the region "X", wherein the filament 8 is heated to the temperature of over 2000° C. by the supply of power, due to the synthesized condition of diamond, thereby having the brittleness of ceramics.

Due to the brittleness by carburization, the filament 8 is easily broken by small impact and fracture. As a result, the filament does not play its role as a heat source because of the breakage of the filament.

However, the filament 8 is maintained as it is in the region "Y" of FIG. 3, having the metal characteristic, in spite of its transformation resulting from thermal expansion, contraction and carburization due to the rise of the temperature. As a result, the breakage of the filament 8 is prevented because the fracture of the filament 8 by longitudinal thermal expansion is occurred in the region "Y" maintaining the metal characteristic.

In other words, in synthesizing diamond, the filament 8 is usually broken by the change in temperature during thermal expansion or contraction by heating and cooling. Each filament 8 is continuously changed in its length corresponding to the temperature in spite of the regulation of the filament under the same condition of rising temperature.

For example, the temperature of the filament 8 locally increase or decrease when a gas is injected in synthesizing diamond or when temperature is properly adjusted to synthesize diamond. Unless changes in length of the filament are regulated according to changes in temperature, the carbonized filament having the brittleness is broken.

Like the present invention, if there is no region wherein the filament does not generate heat, the filament is changed in its length at high temperature, and the stress due to the fracture is occurred in the region of the carbonized filament having the brittleness. As a result, the filament 8 is broken.

However, in the present invention, the filament maintains its metal characteristic in the region "Y" as shown in FIG. 3. Accordingly, only the region "Y" is able to cope with the change in length of filament and the stress due to the fracture, thereby preventing the breakage of the filament 8.

Hereinafter, the preferred embodiments of the present invention will be described.

EXAMPLE 1

The radius of the curved surface is 20 mm, the curved surface on one side of the fixed electrodes whereon the filament is hung. The distance between two electrodes is 25 cm. The comparison chart according to (1) the diameter of the filament placed over each electrode, (2) the size and the existence of the region ("Y" in FIG. 3) of the flat surface parallel with the filament and (3) the size of the weight applying the tension to each filament is as follows:

Comparison Chart 1

The possibility of reusing the filament and the breakage of the filament according to (1) its diameter, (2) the weight and (3) the existence of the flat surface region "Y" in electrodes

| Diameter (mm) | Weight (gram) | Size of region "Y" | Result on Filament |
| --- | --- | --- | --- |
| 0.05 | 1 | 0 | Breakage |
| 0.05 | 1 | 10 | Reusable |
| 0.05 | 5 | 10 | Breakage |
| 0.1 | 1 | 0 | Breakage |
| 0.1 | 5 | 10 | Reusable |
| 0.1 | 10 | 10 | Breakage |
| 0.2 | 5 | 0 | Breakage |
| 0.2 | 10 | 10 | Reusable |
| 0.2 | 15 | 10 | Reusable |
| 0.2 | 30 | 15 | Breakage |
| 0.3 | 5 | 0 | Failure in being level |
| 0.3 | 20 | 0 | Breakage |
| 0.3 | 20 | 10 | Reusable |
| 0.3 | 50 | 15 | Breakage |
| 0.5 | 20 | 0 | Failure in being level |
| 0.5 | 40 | 0 | Breakage |
| 0.5 | 40 | 15 | Reusable |
| 0.7 | 100 | 15 | Reusable |

As shown in the above comparison chart, when electrodes having no region "Y" are used, almost all of the filaments are broken by 1~3 thermal expansion by heating and contraction by cooling.

However, when there is the region "Y" which is the flat surface region of filament in electrodes, the filament may be continuously reusable.

In addition, there are weights that may enable the filament to have the optimum performance according to its diameter. If the filament is not fastened by more tension than a predetermined degree of weights, it is impossible to adjust the slackening filament resulting from the weight of the filament to be level.

When the tension is applied to the filament with more weights than it needs, the filament is broken by its continuous transformation at high temperature.

EXAMPLE 2

Diamond of insert-type tools is coated by setting the apparatus of the present invention as follows.

The radius of the curved surface is 20 mm, the curved surface of the fixed electrodes whereon the filament is hung. The region "Y" of the flat surface is 10 mm, the flat surface formed on the top portion of electrodes. Here, the distance between electrodes is 25 cm. The 15 tungsten filaments having the diameter of 0.2 mm are used. The both ends of each tungsten filament are weighed with metals having the weight of 10 g. The filament smoothly hung to the electrodes is arranged in each slot formed on the flat surface of the electrodes. Here, each filament is not exactly parallel with its neighboring filament due to the rigidity of tungsten filament.

After this tungsten filament is installed, the power is supplied then the filament begins to be carbonized with rising temperature and the mixed gas consisting of methane of 2% and hydrogen of 98% is also supplied with the pressure of 40 torr. Then, the filament is longitudinally expanded by thermal expansion, and slackened by its weight. If it is heated to the temperature of 2000° C. in the middle portion of the filament (the middle portion between electrodes), the filament is slackened to about 10 mm.

However, this slackened filament gradually becomes horizontal because it is given the tensile stress due to the tension of the weights on the filament. The filament is just carbonized in the region "X" of FIG. 3 as described above.

After it is, under this condition, carbonized by the heat for about 10 hours, the filament is cooled by cutting off the power. As a result, the filament is not carbonized in the region "Y" of the flat surface in FIG. 3.

After the filament is cooled, the substrate is mounted under the filament. While the insert tool is put on the top portion of the substrate, diamond is coated.

While the mixed gas as described above is supplied with the pressure of 40 torr, the power is supplied so that the filament may have the temperature of 2200° C. and the substrate of 850°.

Here, the carbonized filament maintains it horizontality due to the weights on the filament. Before it is settled at a predetermined temperature or when the temperature is rising, the filament is repeatedly expanded and contracted by its heat.

Although the filament may have the thermal expansion larger than in its carburization, the fracture stress resulting from the change in it length is occurred in the region "Y" of the uncarbonized flat surface, thereby the filament is not broken and may generate heat to a predetermined temperature.

After diamond is coated and then cooled, the coated insert tool is taken out of the synthesizing equipment. An insert tool that will be newly coated is then re-put in the equipment. In the same way, as described above, the diamond is coated.

Although the filament is repeatedly expanded and contracted in the same way, the diamond may be coated without breakage of the filament. Based on the time of 20 hours in coating diamond at one time, the diamond is repeatedly coated about ten times. However, the filament may be reusable without breakage.

Additionally, if silicon wafer is put on the substrate instead of the insert tool under the same condition as described above, the uniform film of diamond having the thickness of ±10% may be synthesized on the wafer having the diameter of 4 inches.

As described earlier, in the present invention, the apparatus for forming diamond via a chemical vapor deposition process using hot metal filament can solve the most important problem of the breakage of the filament resulting from its heat expansion, contraction and carburization. Due to the apparatus of the present invention, the filament can have larger size in synthesizing diamond. Most of all, it is possible to use the filament repeatedly unlike the conventional filament, thereby resulting in simplifying the process for coating diamond. Therefore, the present invention is remarkably useful to improve the competitiveness for synthesizing diamond.

What is claimed is:

1. A chemical vapor deposition apparatus for depositing diamond at high temperatures, wherein the chemical vapor includes hydrogen and methane gas, comprising:
   a pair of electrodes having conductivity and being located symmetrically from each other at a predetermined interval on a central base substrate wherein diamond is synthesized; and
   a plurality of metal filaments placed over the pair of electrodes and fastened by metal weights hanged to the both ends of each filament,
   wherein the filaments placed over and between the electrodes are heated when a power supply is applied to the electrodes, but portions of each filament contacting the electrodes are not heated.

2. The apparatus according to claim 1, wherein each of the electrodes comprises a flat upper surface and a curved surface formed on an outer side; and the plurality of filaments are placed over the flat upper surface and the curved surface,
   wherein two electrodes are formed in parallel to each other.

3. The apparatus according to claim 2, wherein the plurality of filaments placed over the pair of electrodes are located in parallel with each other at predetermined intervals.

4. The apparatus according to claim 3, wherein a plurality of slots are formed in parallel with each other at a predetermined interval on the flat surfaces of the electrodes, and the plurality of filaments are located on the slots respectively.

5. The apparatus according to claim 4, wherein conductive cover plates are set on the top portions of the filaments placed over the flat surfaces.

* * * * *